United States Patent [19]
Chung

[11] Patent Number: 5,656,543
[45] Date of Patent: Aug. 12, 1997

[54] FABRICATION OF INTEGRATED CIRCUITS WITH BORDERLESS VIAS

[75] Inventor: Henry Wei-Ming Chung, Cupertino, Calif.

[73] Assignee: National Semiconductor Corporation, Santa Clara, Calif.

[21] Appl. No.: 519,456

[22] Filed: Aug. 25, 1995

Related U.S. Application Data

[63] Continuation-in-part of Ser. No. 383,597, Feb. 3, 1995, abandoned.

[51] Int. Cl.$^6$ .................... H01L 21/283; H01L 21/311
[52] U.S. Cl. .................... 438/625; 438/636; 438/637; 438/970
[58] Field of Search .................... 437/187, 189, 437/190, 192, 194, 195, 228 ES, 228 S; 257/751, 758, 760

[56] References Cited

U.S. PATENT DOCUMENTS

| | | | |
|---|---|---|---|
| 4,523,372 | 6/1985 | Balda et al. | 29/590 |
| 4,656,732 | 4/1987 | Teng et al. | 29/591 |
| 4,948,755 | 8/1990 | Mo | 437/195 |
| 5,005,067 | 4/1991 | Sakata et al. | 357/54 |
| 5,187,122 | 2/1993 | Bonis | 437/200 |
| 5,243,220 | 9/1993 | Shibata et al. | 257/748 |
| 5,262,353 | 11/1993 | Sun et al. | 437/195 |
| 5,286,674 | 2/1994 | Roth et al. | 437/190 |
| 5,290,720 | 3/1994 | Chen | 437/41 |
| 5,291,066 | 3/1994 | Neugebauer et al. | 257/750 |
| 5,300,814 | 4/1994 | Matsumoto et al. | 257/758 |
| 5,317,192 | 5/1994 | Chen et al. | 257/750 |
| 5,321,211 | 6/1994 | Haslam et al. | 174/262 |
| 5,349,229 | 9/1994 | Wei et al. | 257/383 |
| 5,350,712 | 9/1994 | Shibata | 437/195 |
| 5,407,532 | 4/1995 | Fang et al. | 156/656 |
| 5,407,862 | 4/1995 | Miyamoto | 437/192 |
| 5,416,359 | 5/1995 | Oda | 257/751 |
| 5,462,893 | 10/1995 | Matsuoka et al. | 437/195 |
| 5,466,636 | 11/1995 | Cronin et al. | 437/187 |
| 5,545,581 | 8/1996 | Armacost et al. | 437/52 |

OTHER PUBLICATIONS

Stanley Wolf, "Silicon Processing for the VLSI Era", vol. 2—Process Integration: Chapter 4, Multilevel–Interconnect Technology for VLSI and ULSI, pp. 176–297.
"*IBM Technical Disclosure Bulletin*", Copper Multilevel Interconnections, vol. 33, No. 11, Apr. 1991, pp. 299–300.
"*Silicon Processing for the VLSI Era*", vol. 1, Lattice Press, 1986, Stanley Wolf et al., pp. 441, 546, 555, 556.

*Primary Examiner*—T. N. Quach
*Attorney, Agent, or Firm*—Limbach & Limbach L.L.P.

[57] ABSTRACT

A method of forming interconnecting layers in a semiconductor device is such that, whereby even if a via is misaligned with a metal line, a portion of the via not enclosed by the metal is enclosed by an etch stop spacer. In addition, the via is always capped by the metal even if borders are not used in the design of the device. A metal layer is formed atop the foundation layer to cover the boundary layer, including completely filling the trench with metal. A protection layer is then formed on the surface of the metal layer. The protection layer and the metal layer are patterned to define a line of composite protection/metal on the surface of the foundation layer while leaving a remaining portion of the metal layer exclusive of the metal of the line. An etch stop layer is formed which substantially conforms to the shape of the line and to the remaining portion of the metal layer. Selected portions of the etch stop layer are removed to expose the protection surface of the line, and to leave etch stop spacers conforming to at least one sidewall portion of the line while exposing a sub-portion of the remaining portion of the metal layer. The exposed sub-portion of the metal layer is removed to expose a portion of the boundary layer, then the exposed portion of the boundary layer is removed. A layer of via dielectric is formed that covers and extends above the line. A portion of the via dielectric layer above the line is removed to expose a portion of the protection surface of the line. Finally, at least a portion of the protection surface is removed from the line, leaving the metal portion of the line only.

11 Claims, 18 Drawing Sheets

FABRICATION OF INTEGRATED CIRCUITS WITH BORDERLESS VIAS

RELATED APPLICATIONS

This application is a continuation-in part application of Ser. No. 08/383,597, entitled "INTEGRATED CIRCUITS WITH BORDERLESS VIAS", filed Feb. 3, 1995, abandoned.

TECHNICAL FIELD OF THE INVENTION

The present invention relates to integrated circuits, and in particular, integrated circuits with borderless vias.

BACKGROUND OF THE INVENTION

Integrated circuit fabrication begins with a thin, polished slice of high-purity, single crystal semiconductor, usually silicon. Junctions (which make up devices) are formed between field oxide portions of the semiconductor slice. Metal lines in conductor layers provide necessary electrical connections between the devices. Dielectric (i.e. insulating) layers are formed between the conductor layers to isolate the metal lines from each other. Vias provide conducting paths through the dielectric layers to connect interconnects of different conductor layers.

FIG. 1 is a perspective view of a portion 100 of an integrated circuit having a conventional interconnect architecture; FIG. 2 is a cross-sectional view of the integrated circuit portion 100 shown in FIG. 1; and FIG. 3 is a plane view of the integrated circuit portion 100 shown in FIGS. 1 and 2.

In the integrated circuit portion 100, two "bottom metal" strips 102a, 102b are formed in a bottom layer and two "top metal" strips 104a, 104b are formed perpendicular to the bottom metal strips 102a, 102b. Vias through a dielectric layer 108 connect the "top metal" strips to the "bottom metal" strips. In the integrated circuit portion 100 shown in FIGS. 1-3, via 106aa connects bottom metal strip 102a to top metal strip 104a; via 106ab connects bottom metal strip 102a to top metal strip 104b; via 106ba connects bottom metal strip 102b to top metal strip 104a; and via 106bb connects bottom metal strip 102b to top metal strip 104b.

As can be seen from FIGS. 1-3, in the integrated circuit portion 100 having the conventional interconnect architecture, each via is fully covered and is bordered by the top metal strip above it (overlap) and each via is also fully enclosed and bordered by the bottom metal strip below it (enclosure). Via borders provide allowance for interconnect misalignment and other process variations. That is, if a via is not fully bordered by the bottom metal strip to which it is to connect, during formation of the via, the dielectric layer, which is to insulate the bottom metal layer from the top metal layer, is attacked during etching of the vias. In extreme cases, even the devices may be attacked. Furthermore, if a via will not be fully bordered by the top metal strip to which it is to connect, the via liners can be attacked during etching of the top metal.

If the via borders required in the conventional interconnect architecture can be eliminated, increased packing density can be achieved. For example, in the conventional bordered via architecture, if the via size is 0.5 um, borders required to protect against potential via misalignment need to be at least 0.15 um. Thus, with bordered vias, the metal linewidth should be 0.8 um, the via size plus twice the via border. If the space between the metal lines at a particular level is 0.5 um, the metal pitch (linewidth+space) is 1.3 um for bottom and top metals running perpendicular to each other.

SUMMARY OF THE INVENTION

The present invention is a method of forming interconnecting layers in a semiconductor device whereby, even if a via is misaligned with a metal line, a portion of the via not enclosed by the metal is enclosed by an etch stop spacer and the via is always capped by the metal even though borders are not used.

A foundation layer of the semiconductor device includes a dielectric layer having at least one trench formed therein. A barrier layer covers the dielectric layer such that the boundary layer lines, but does not completely fill, the trench. A metal layer is formed atop the foundation layer to cover the boundary layer, including completely filling the trench with metal. A protection layer is then formed on the surface of the metal layer. The protection layer and the metal layer are patterned to define a line of composite protection/metal on the surface of the foundation layer while leaving a remaining portion of the metal layer exclusive of the metal of the line. An etch stop layer is formed which substantially conforms to the shape of the line and to the remaining portion of the metal layer. Selected portions of the etch stop layer are removed to expose the protection surface of the line, and to leave etch stop spacers conforming to at least one sidewall portion of the line while exposing a sub-portion of the remaining portion of the metal layer. The exposed sub-portion of the metal layer is removed to expose a portion of the boundary layer, then the exposed portion of the boundary layer is removed. A layer of via dielectric is formed that covers and extends above the line. A portion of the via dielectric layer above the line is removed to expose a portion of the protection surface of the line. Finally, at least a portion of the protection surface is removed from the line, leaving the metal portion of the line only.

A better understanding of the features and advantages of the invention will be obtained by reference to the following detailed description and accompanying drawings which set forth an illustrative embodiment in which the principles of the invention are utilized.

BRIEF DESCRIPTION OF THE FIGURES

FIGS. 6–12 show the integrated circuit portion after being processed such that:

FIG. 6 shows the integrated circuit portion of FIG. 5 after the protection layer and the bottom metal layer have been patterned to define protection/metal composite lines.

FIG. 7 shows the integrated circuit portion of FIG. 6 after an etch stop layer has been formed on the surface of the barrier layer and substantially conforming to the shape of the at least one line. The etch stop layer includes etch stop spacers on the sidewall portions of the line.

FIG. 8 shows the integrated circuit portion of FIG. 7 after selected portions of the etch stop layer have been removed, leaving the etch stop spacers.

FIG. 9 shows the integrated circuit portion of FIG. 8 after portions of the boundary layer between the etch stop spacers have been removed.

FIG. 10 shows the integrated circuit portion of FIG. 9 after a via hole trench has been formed in a via dielectric layer above a metal line.

FIG. 11 shows the integrated circuit portion of FIG. 10 after the via hole trench has been lined with a plug liner and filled with a plug.

FIG. 12 shows the integrated circuit portion of FIG. 11 after a further barrier layer has been formed above the via and via dielectric, a metal line has been formed above the barrier layer, and an etch stop spacer has been formed.

FIGS. 14–19 show the integrated circuit portion after being processed such that:

FIG. 14 shows the integrated circuit portion of FIG. 5 after the protection layer, the bottom metal layer, and the boundary layer have been patterned to define protection/metal/boundary composite lines.

FIG. 15 shows the integrated circuit portion of FIG. 14 after an etch stop layer has been formed on the surface of the barrier layer and substantially conforming to the shape of the lines. The etch stop layer includes etch stop spacers on the sidewall portions of the lines.

FIG. 16 shows the integrated circuit portion of FIG. 15 after selected portions of the etch stop layer have been removed, leaving the etch stop spacers.

FIG. 17 shows the integrated circuit portion of FIG. 16 after a via hole trench has been formed in a via dielectric layer above a metal line.

FIG. 18 shows the integrated circuit portion of FIG. 17 after the via hole trench has been lined with a plug liner and filled with a plug.

FIG. 19 shows the integrated circuit portion of FIG. 18 after a further barrier layer has been formed above the via and via dielectric, a metal line has been formed above the barrier layer, and an etch stop spacer has been formed.

FIGS. 20–30 show the integrated circuit portion after being processed in accordance with the present invention, in which FIG. 20 shows the integrated circuit portion after a foundation layer has been formed.

FIG. 21 shows the integrated circuit portion after a bottom metal layer has been formed.

FIG. 22 shows the integrated circuit portion after a protection layer has been formed over the metal layer.

FIG. 23 shows the integrated circuit portion after the protection layer and the bottom metal layer have been patterned to define at least one line.

FIG. 24 shows the integrated circuit portion after an etch stop layer has been formed.

FIG. 25 shows the integrated circuit portion after selected portions of the etch stop layer have been removed, leaving etch stop spacers.

FIG. 26 shows the integrated circuit portion after the portions of the metal layer between the etch stop spacers have been removed.

FIG. 27 shows the integrated circuit portion after a via dielectric layer has been formed above the metal line.

FIG. 28 shows the integrated circuit portion after a via has been formed in the via dielectric layer, above but misaligned to the metal line.

FIG. 29 shows the integrated circuit portion after the via dielectric layer, including the via, has been covered with a barrier layer.

FIG. 30 shows the integrated circuit portion after a further barrier layer and metal line have been formed over the via dielectric layer.

DETAILED DESCRIPTION OF THE INVENTION

Processes for fabricating a borderless interconnect architecture, as well as the borderless interconnect architecture itself, is now described.

Figure 1:
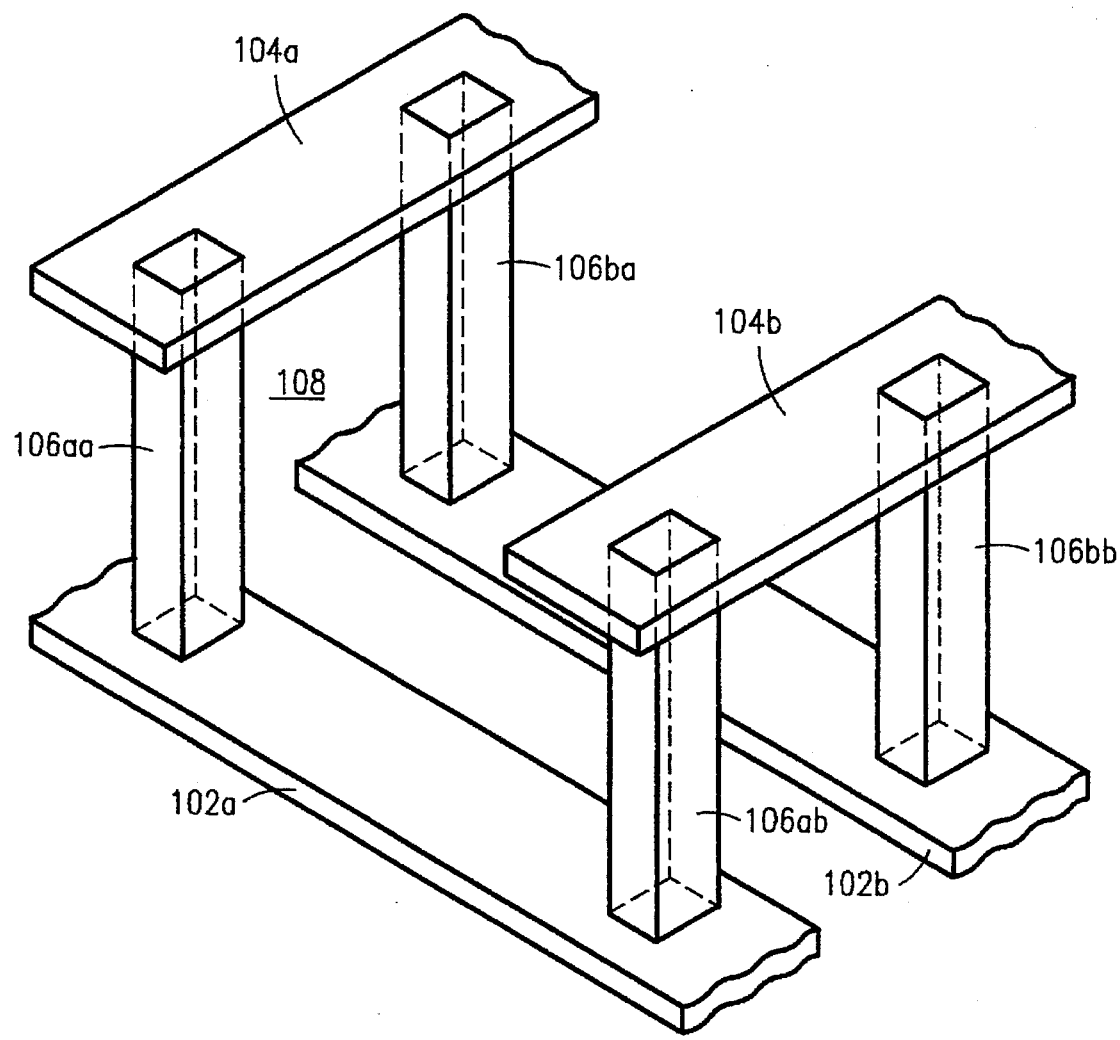
FIG. 1 is a perspective view of a portion of an integrated circuit having a conventional interconnect architecture.
Figure 2:
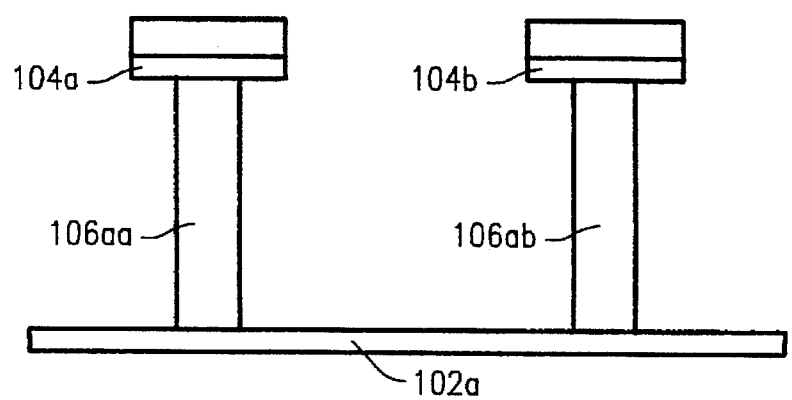
FIG. 2 is a cross-sectional view of the integrated circuit portion shown in FIG. 1.
Figure 3:
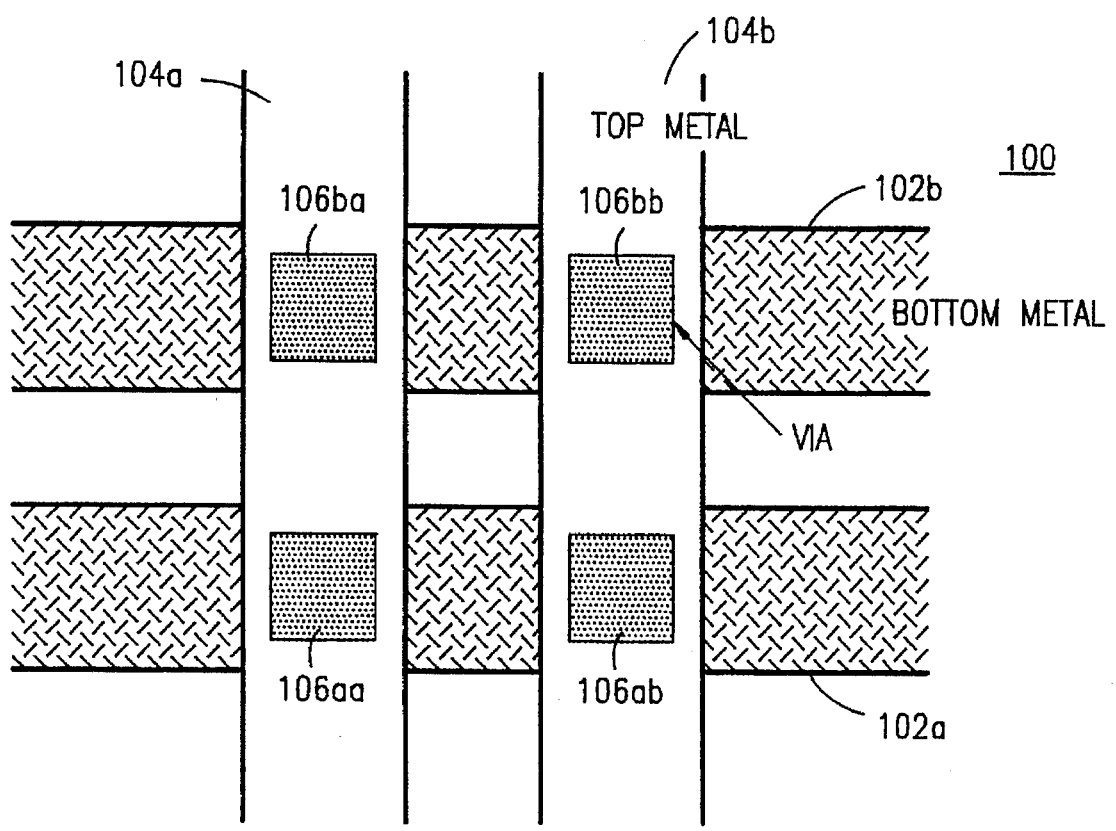
FIG. 3 is a plan view of the integrated circuit portion shown in FIGS. 1 and 2.
Figure 4:
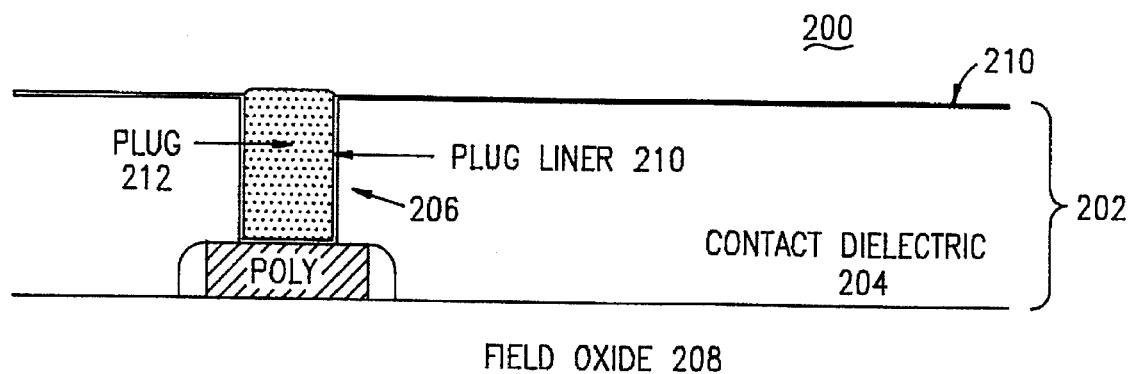
FIG. 4 shows, in cross section, an integrated circuit portion which comprises a conventional foundation layer fabricated by a conventional process.

FIG. 4 shows, in cross section, an integrated circuit portion 200 which comprises a conventional foundation layer 202 fabricated by a conventional process. The foundation layer includes a dielectric layer 204 having at least one trench (or contact) 206, shown in FIG. 4, which is a contact to poly formed, e.g., over a semiconductor field oxide layer 208, onto silicon. The trench 206 is lined with a plug liner 210. The foundation layer 202 further comprises a barrier layer which is a portion of the plug liner 210 that covers the contact dielectric layer 204. The trench 206 is filled with a plug material 212. For example, the contact 206 in FIG. 4 may be lined with a sputtered titanium ("Ti")/ sputtered titanium nitride ("TiNx") bilayer; sputtered Ti/sputtered titanium-tungsten ("TiW") bilayer; sputtered Ti/sputtered tungsten ("W") bilayer; sputtered W single layer; sputtered Ti/chemical vapor deposited titanium nitride ("CVD TiNx") bilayer; or CVD Ti/CVD TiNx bilayer. The contact may be filled, for example, with chemical vapor deposited tungsten (CVD W). If necessary, a blanket etchback or chemical-mechanical polishing process may be applied to remove plug material outside the plug hole 212, so that plug material remains only in the plug hole 212.

Figure 5:
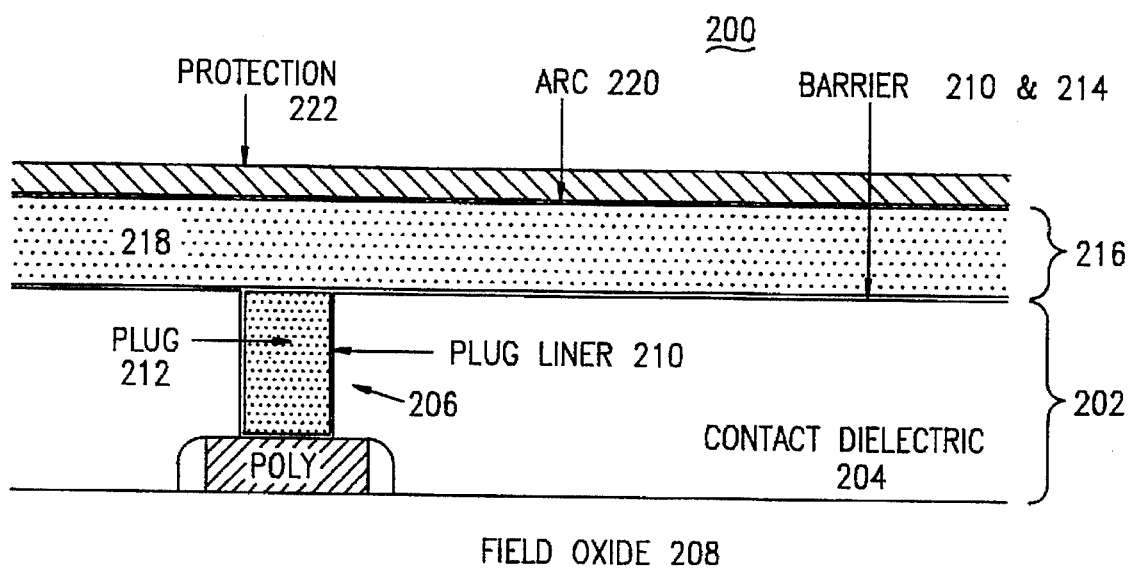
FIG. 5 shows the integrated circuit portion of FIG. 4 after it has been conventionally processed up to the point of bottom metal layer formation and after it has been processed in accordance with the present invention to form a protection layer atop a bottom metal layer.

FIG. 5 also shows the integrated circuit portion 200 of FIG. 4. As shown in FIG. 5, the barrier layer of the foundation layer further comprises a second layer 214. (In further discussion, the barrier layer is designated as 210+ 214.) The most common material used for the second layer 214 of the barrier layer 210+214 is a bi-layered film of Ti and TiNx. However, other materials, such as thin films of sputter deposited TiW or W, may also be employed in the place of TiNx.

As is now discussed, FIG. 5 shows the integrated circuit portion 200 after it has been conventionally processed up to the point of bottom metal layer formation. The bottom metal layer 216 includes a primary layer 218 and, optionally, an anti-reflection coating 220 ("ARC"). For the primary layer, a thin film of aluminum-based alloy (for example, Al-0.5% Cu or Al-1%Si-0.5% Cu) may be employed.

The ARC may be, for example, TiNx. The ARC, when present, improves the efficiency of the photo-lithography.

The integrated circuit portion 200 shown in FIG. 5 has been further processed to form a protection layer 222 atop the bottom metal layer 216. The protection layer 222 may be, for example, an oxide layer formed by depositing a plasma-enhanced Tetraethyl Orthosilane ("PE-TEOS'") oxide atop the bottom metal layer 216. In this case, as is discussed in detail below with reference to FIG. 7, the thickness of the protection oxide is related to the plasma-enhanced chemical vapor deposition silicon nitride ("PECVD silicon nitride") to oxide etch selectivity.

Figure 6:
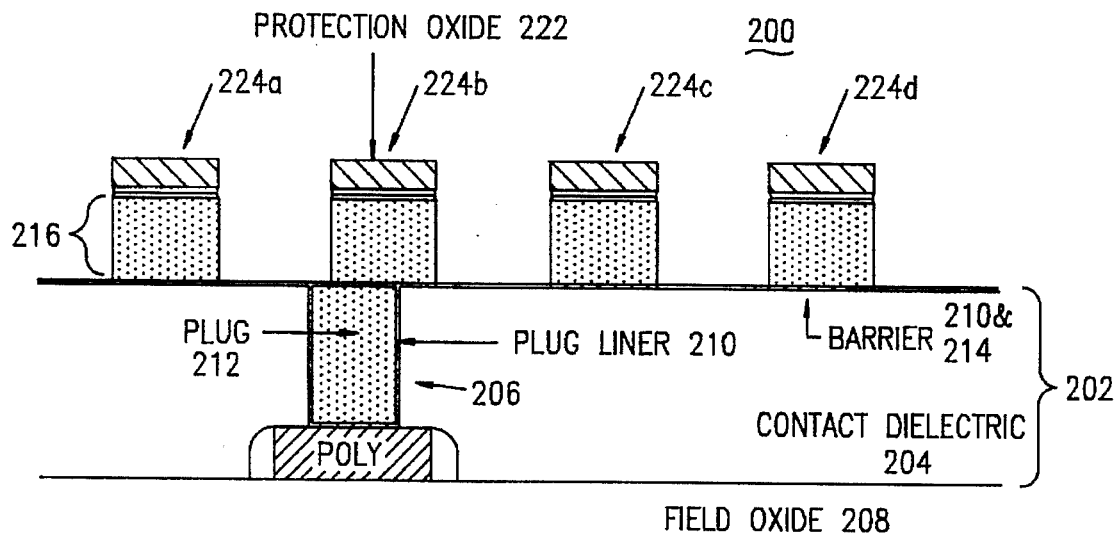

FIG. 6 shows the integrated circuit portion 200 after the protection layer 222 and the bottom metal layer 216 have been patterned to define at least one line (four lines 224a–224d are shown in FIG. 6) of composite protection/ metal on the surface of the boundary layer 210+214. The patterning may comprise, for example, a bottom metal mask step and a bottom metal etch step.

In the bottom metal mask step, photo-resist is spun on the protection oxide layer 222 of the integrated circuit portion 200. Then, a photo-lithographic technique is used to produce a desired interconnect pattern in the photo-resist.

In the bottom metal etch step, the protection silicon oxide is first etched in an anisotropic fluorine-base etch chemistry to remove the portion of the protective silicon oxide below the photo-exposed photo-resist. Then, the metal is etched in an anisotropic chlorine-based etch chemistry. Using an end-point detection method (e.g., optical spectroscopy or DC bias), the bottom metal etch is stopped on or in the barrier layer 210+214.

Figure 14:
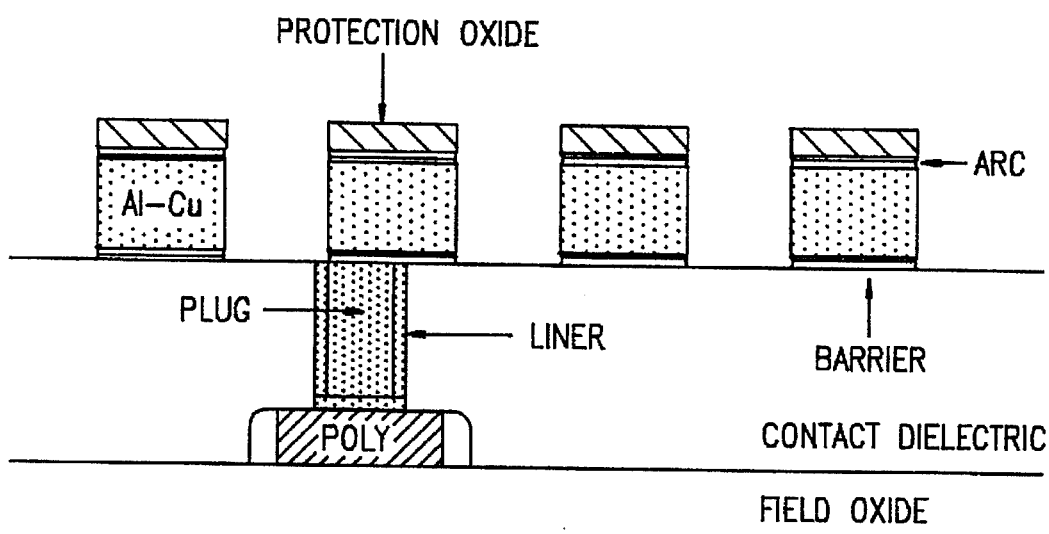

In a first embodiment, in the metal etch step, the second layer 214 of the barrier layer 210+214 is not etched through, and at this point the bottom metal formation process is not yet complete. However, in an alternate embodiment, the etch chemistry used in the metal etch step is such that, although the second layer 214 of the barrier layer 210+214 is etched through, the etch chemistry will not etch through the plug liner 210 of the barrier layer. Thus, the plug itself is protected from being etched, even if the metal line is misaligned to the plug, obviating the need for an overlap. For example, if the plug liner 210 is W-based and the etch chemistry is chlorine-based, the plug liner will not be etched through. FIG. 14 shows the integrated circuit portion 200' (for the alternate embodiment, the integrated circuit portion 200 has been alternately denoted by the numeral 200') after it has been processed through bottom metal formation in accordance with the alternate embodiment.

Figure 7:
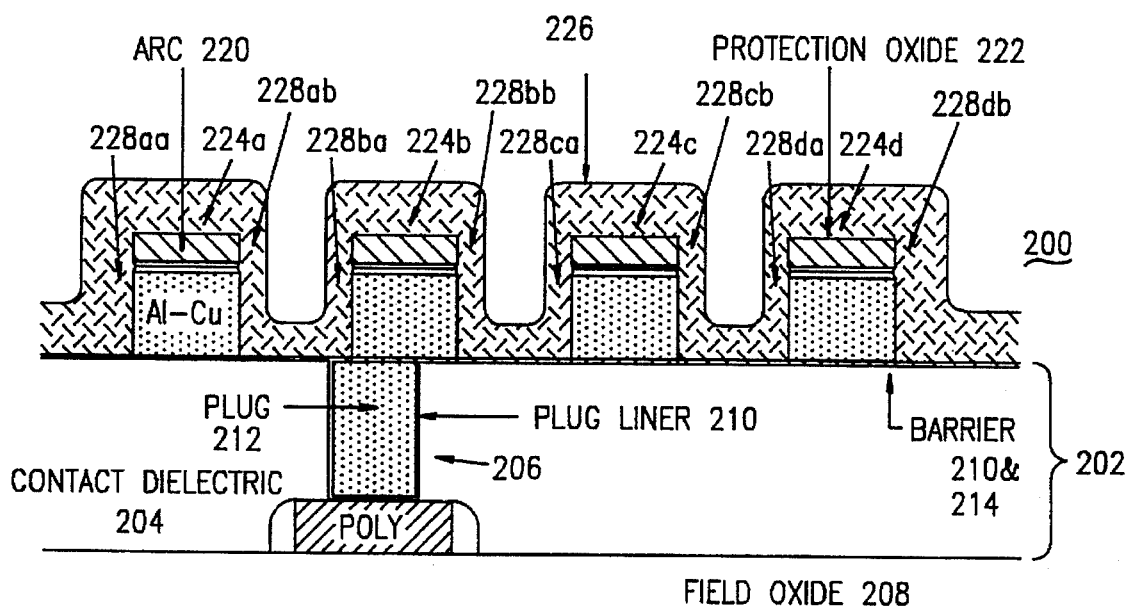
Figure 15:
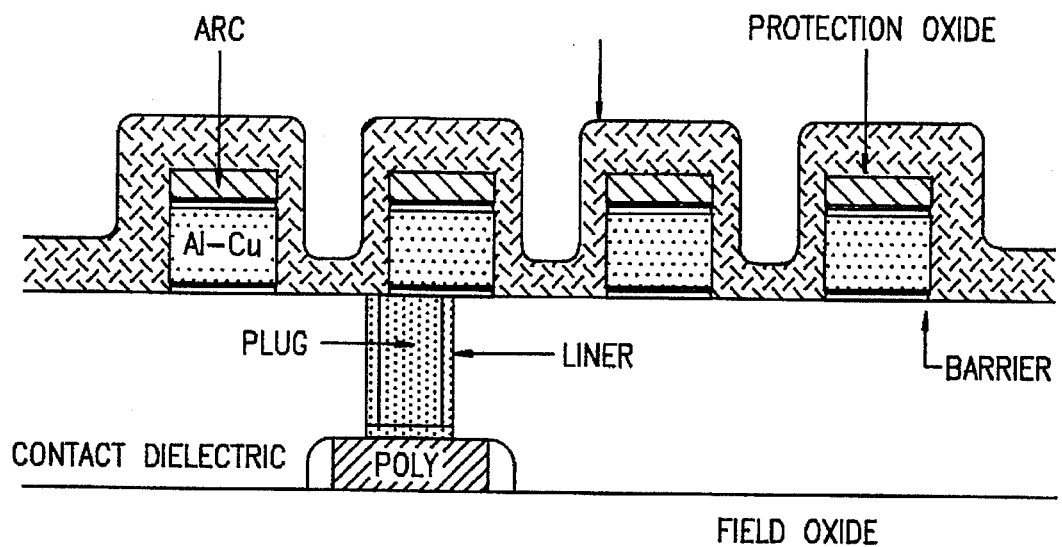

FIG. 7 shows the integrated circuit portion 200 after an etch stop layer 226 has been formed on the surface of the barrier layer 214. (FIG. 15 shows the integrated circuit portion 200'after an etch stop layer 226 has been formed on the surface of the contact dielectric.) The etch stop layer 226 substantially conforms to the shape of the lines 224a–224d of composite protection/metal and thus includes etch stop spacers 228aa–228db on the sidewall portions of the lines. The etch stop layer 226 may be, for example, a silicon nitride film deposited by plasma-enhanced chemical vapor deposition ("PECVD silicon nitride"). As will be discussed with respect to FIG. 8, PECVD silicon nitride has two properties which make it preferable. First, a PECVD silicon nitride to silicon oxide etch selectivity equal to or greater than one can be achieved in a fluorine-based plasma etch chemistry by optimization of process parameters while a significantly large silicon oxide to silicon nitride selectivity can also be achieved by similar optimization in the same etch chemistry.

Referring still to FIG. 7, the thickness of the etch stop layer 226 is such that the coverage on the sides of the bottom metal lines 224a–224d is at least as large as the potential via misalignment to bottom metal and to contact. In other words, the thickness of the etch stop layer 226 is such that the thickness of the etch stop spacers 228aa–228db is at least as large as the via overlap and enclosure, and contact overlap, which would be used in the conventional interconnect fabrication process. Furthermore, the etch stop material should be thin enough, relative to the space between the metal lines 224a–224d, so that key holes (i.e. voids within the dielectric) are not formed between the metal lines 224a–224d.

Figure 8:
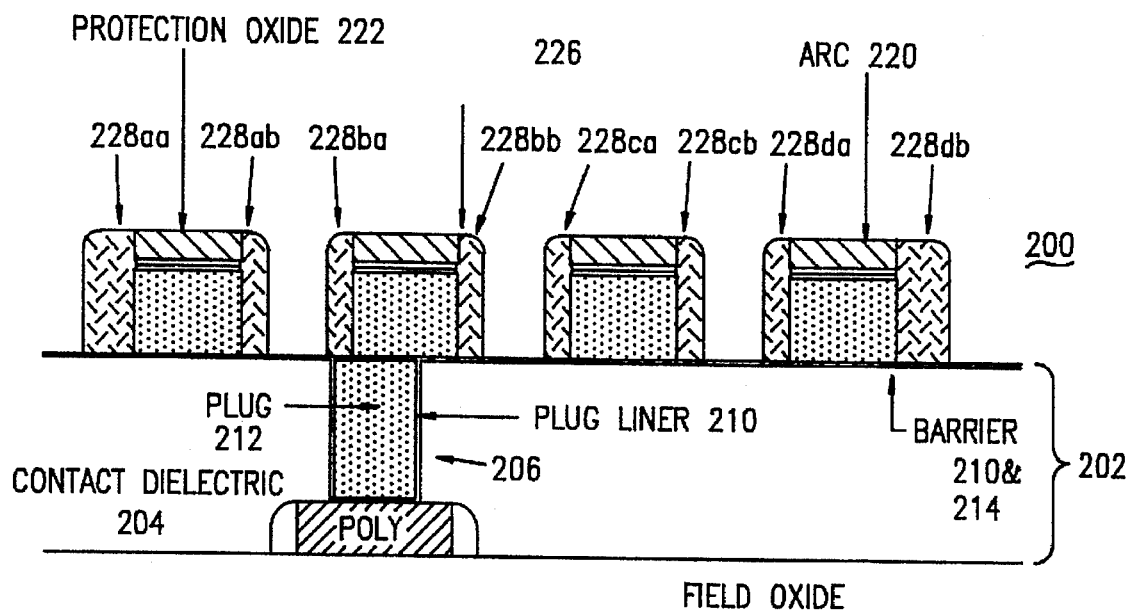
Figure 16:
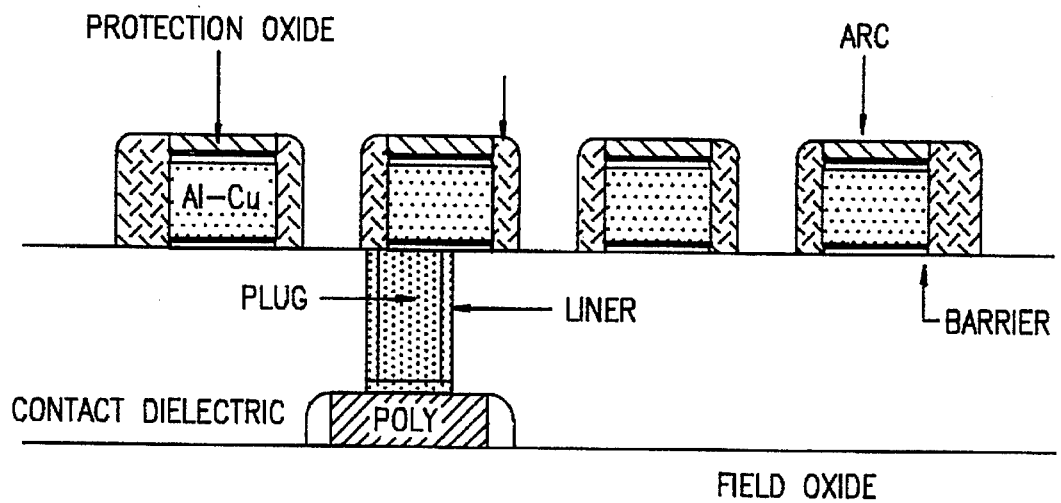

FIG. 8 shows the integrated circuit portion 200 after selected portions of the etch stop layer 226 have been removed, leaving the etch stop spacers 228aa–228db. (FIG. 16 shows the integrated circuit portion 200' after selected portions of the etch stop layer 226 have been removed, leaving the etch stop spacers 228aa–228db.) For example, if the etch stop material is PECVD silicon nitride, a fluorine-based plasma etch is applied to completely remove the PECVD silicon nitride on top of, and in between, the bottom metal lines 224a–224d, except for the spacers 228aa228ab. Preferably, the etch is anisotropic (i.e., it etches only in the vertical direction) so that the thickness of the PECVD silicon nitride etch stop spacers 228aa–228db, on the sidewalls of the bottom metal lines 224a–224d, is preserved. If the etch plasma chemistry is such that the PECVD silicon nitride to silicon oxide, and to TiNx, selectivity is greater than or equal to one, the etching stops in the protection oxide layer 222, on top of the metal lines 224a–224d and in the barrier layer 214 between the bottom metal lines 224a–224d. Furthermore, the protection oxide layer 222 ensures that, during etch, the top of the PECVD silicon nitride spacers 228aa–228db remain above the top surface of the metal lines 224a–224d.

Figure 9:
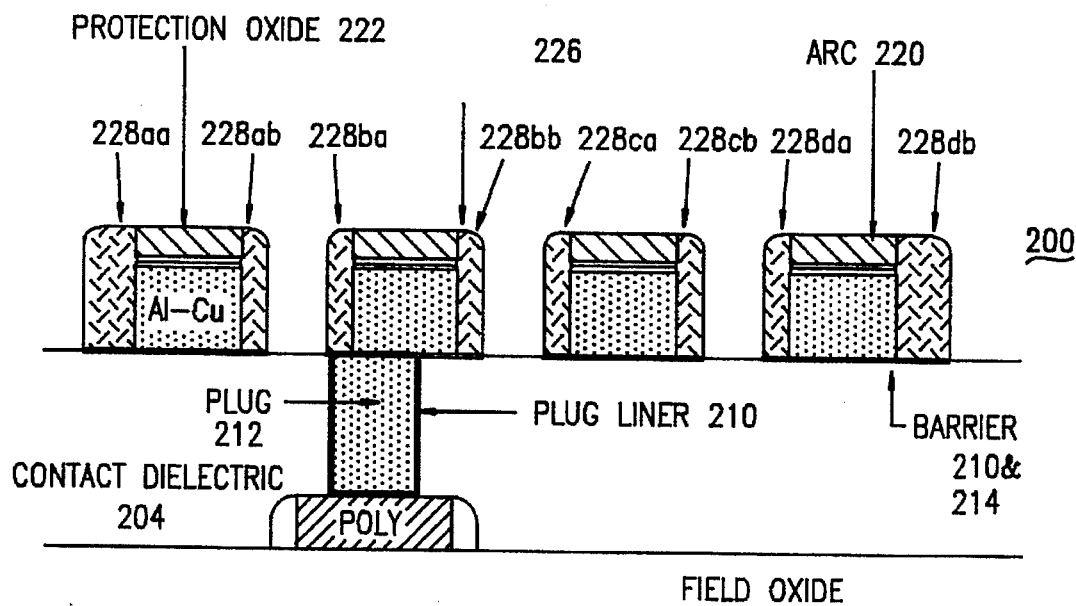

FIG. 9 shows the integrated circuit portion 200 after the portions of the boundary layer between the etch stop spacers 228aa–228db have been removed, for example by a plasma etch, to electrically isolate the bottom metal lines 224a–224d from each other. (In the alternate embodiment, this step is not necessary since the bottom metal lines are electrically isolated from each other after the bottom metal etch step, which also etches through the exposed portions of the boundary layer.)

Figure 10:
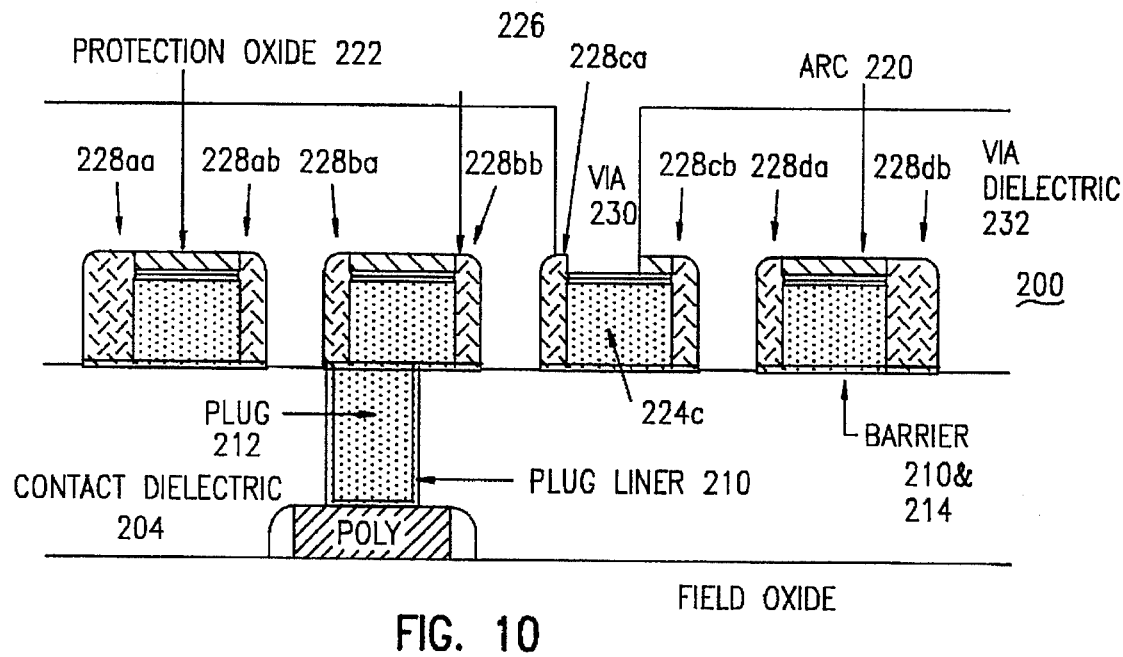
Figure 17:
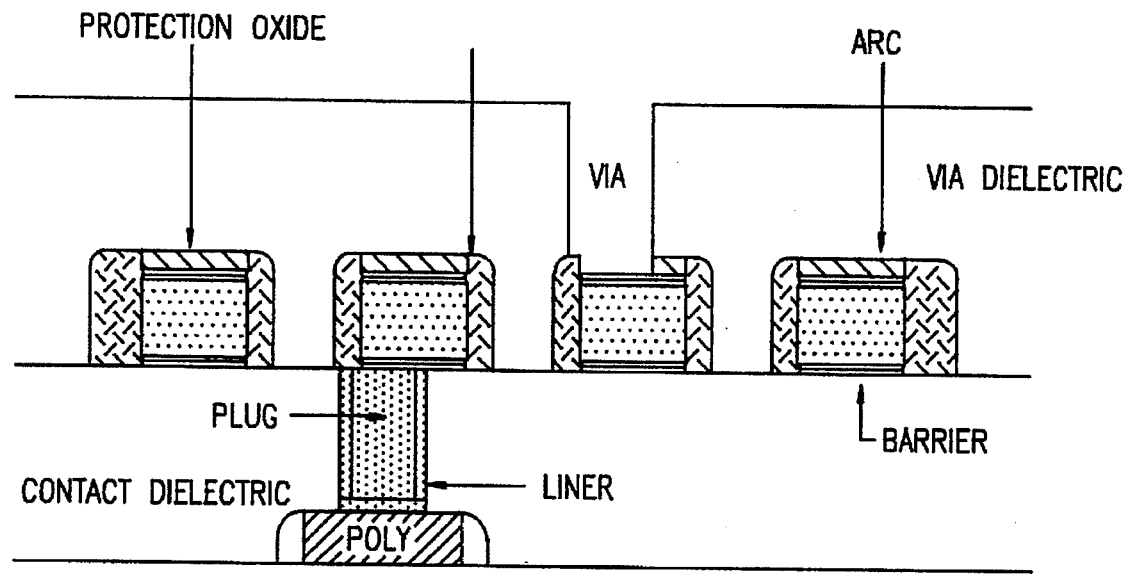

FIG. 10 shows the integrated circuit portion 200 after a misaligned via 230 has been formed above the metal line 224c. (FIG. 17 shows the integrated circuit portion 200'after a via 230 has been formed above the metal line 224c.) First, a via dielectric layer 232 is formed that covers, and extends above, the metal lines 224a–224d. Then, a portion of the via dielectric layer 232, above the metal line 224c, the metal line to be interconnected, is removed to expose a portion of the protection/metal line 224c.

The via dielectric layer 232 can be formed, for example, by depositing gap-filling silicon oxide, such as spin on glass ("SOG") or TEOS-ozone silicon oxide. Optionally, after it has been deposited, the gap-filling oxide can be removed from the top of selected bottom metal lines using a blanket plasma etchback. Then, if SOG has been used to fill the gaps between the bottom metal lines, the SOG is cured at an elevated temperature. The gap-filling oxide is then capped, e.g., with a layer of PECVD TEOS oxide or silane oxide. Preferably, a chemical-mechanical polishing process is then employed to planarize the surface.

Then, the via pattern is produced by, for example, a photo-lithographic masking technique. A via etch is applied to open via holes where the via dielectric layer is exposed. The plasma chemistry used to etch the via holes is such that the silicon oxide to PECVD silicon nitride, and the silicon oxide to metal etch selectivity, are very high. Thus, the etch process stops in metal and PECVD silicon nitride. However, while the etch selectivity is high, it is not infinite. Thus, a small amount of silicon nitride spacer is removed during via etch. Thus, during the etch stop spacer formation step, discussed above with reference to FIGS. 7 and 8 (FIGS. 7 and 14 for the alternate embodiment), it is preferable that the PECVD silicon nitride spacers are formed higher than the level of the bottom metal lines with the use of the protection oxide.

Figure 11:
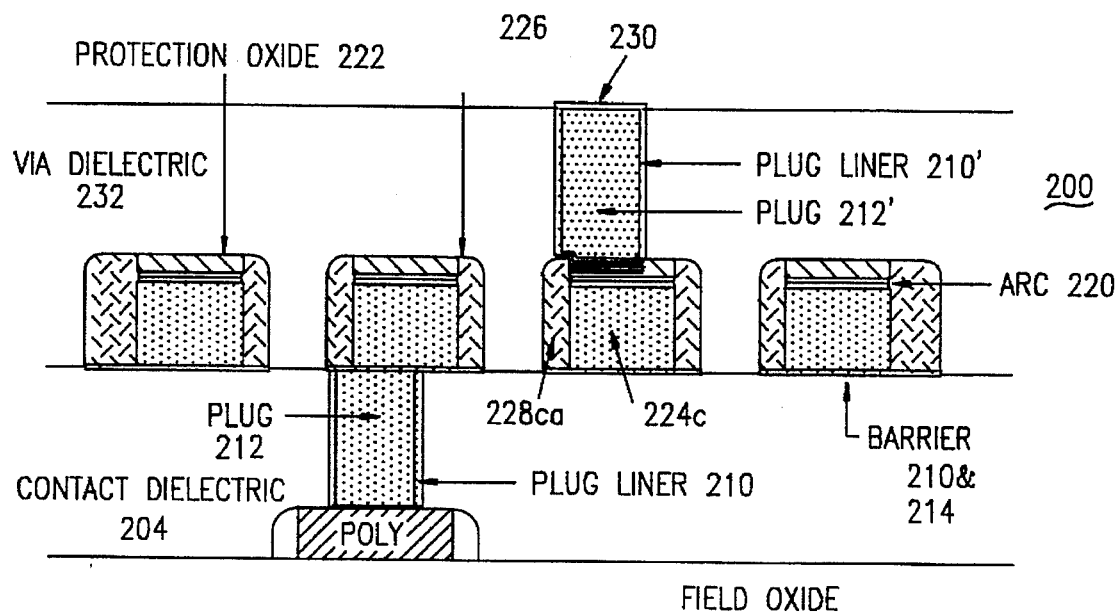
Figure 18:
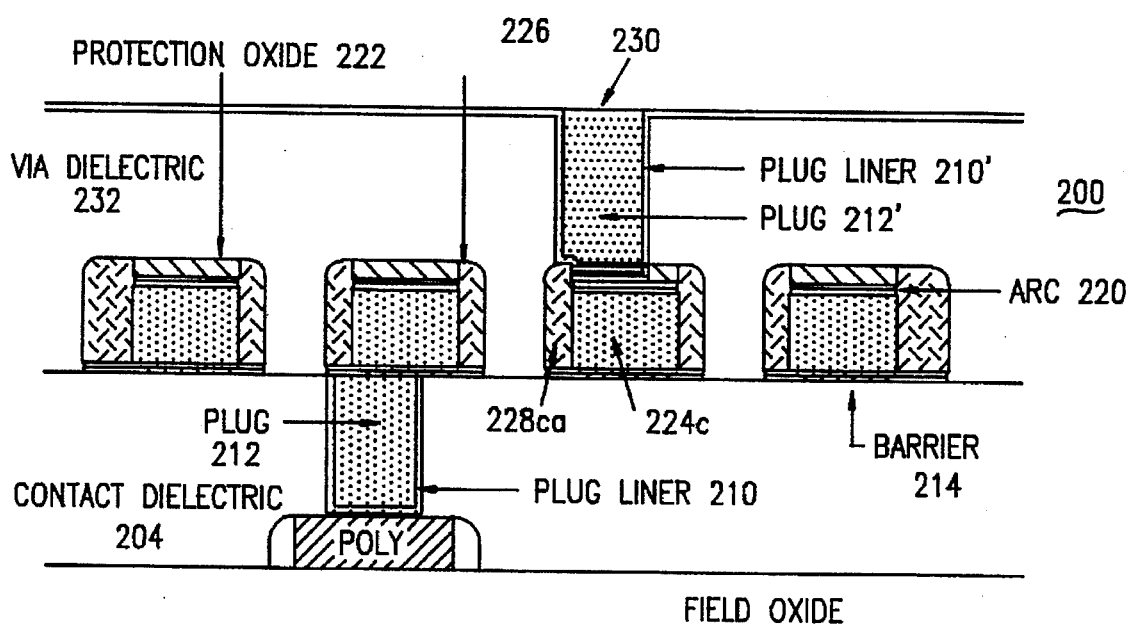

FIG. 11 shows the integrated circuit portion 200 after the via hole trench 230 has been lined with a plug liner 210' and filled with a plug 212', as discussed above with reference to FIG. 4. (FIG. 18 shows the integrated circuit portion 200' after the via hole trench 230 has been lined with a plug liner 210' and filled with a plug 212', as discussed above with reference to FIG. 4.)

Figure 12:
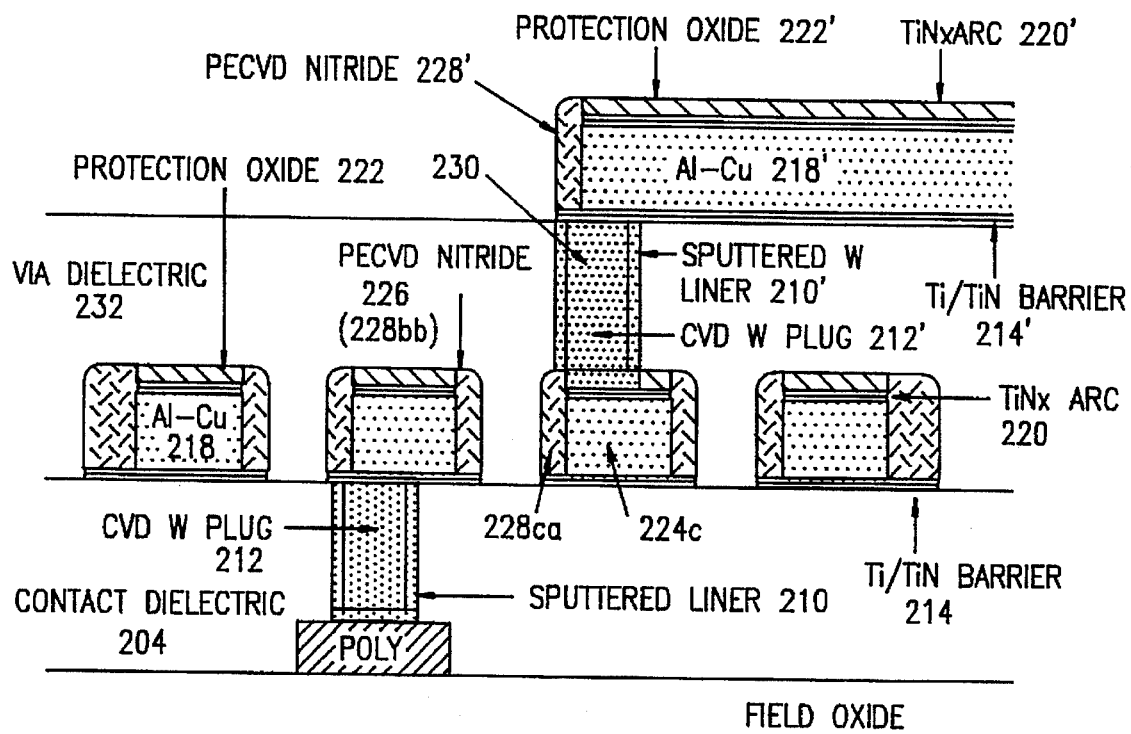
Figure 13:
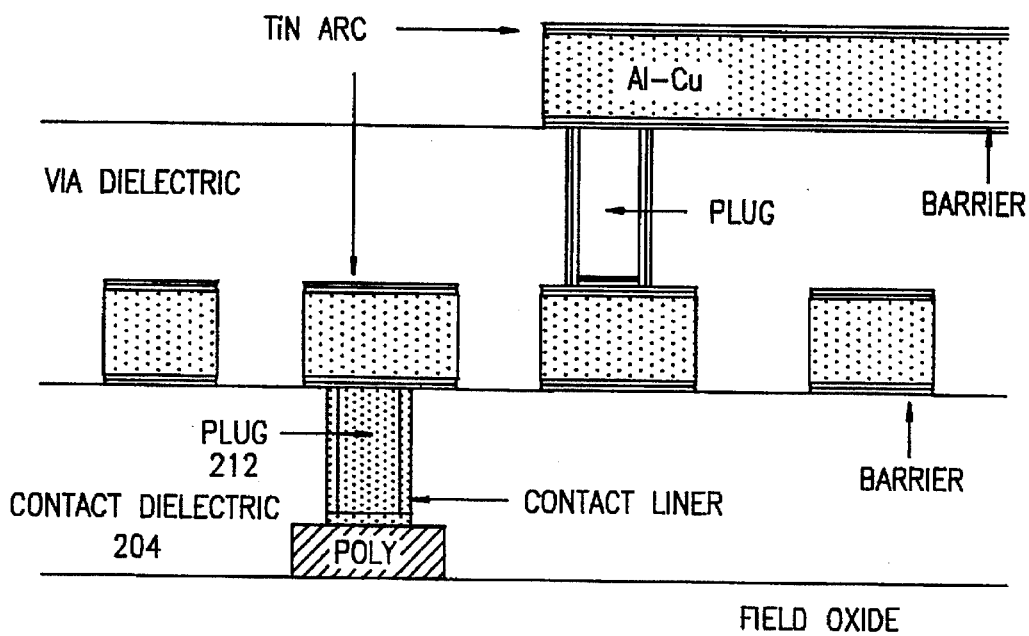
FIG. 13 shows an integrated circuit portion having interconnects formed therein by a conventional method.

As can be seen from FIG. 12 (and, alternatively, from FIG. 19), even if the via 230 is misaligned with the metal line 224c, a portion of the via 230 not enclosed by the metal is enclosed by at least a portion of the etch stop spacer 228ca.

Figure 19:
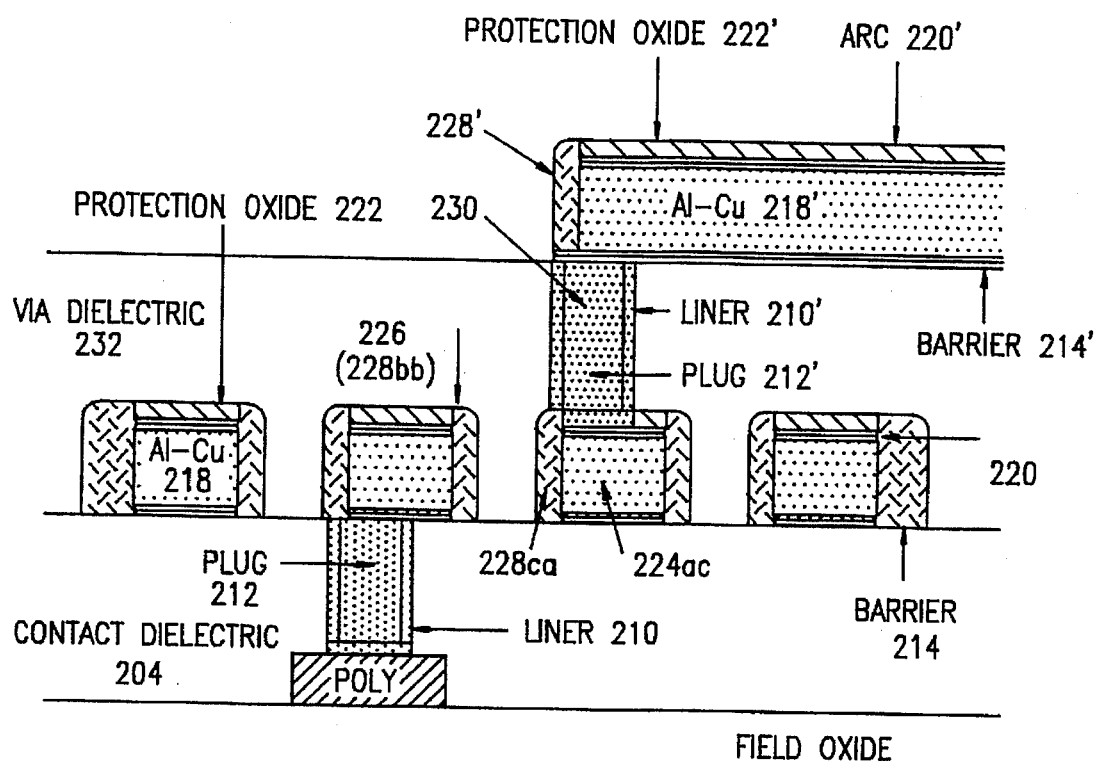

The process illustrated in FIGS. 4–11 (or, alternately, FIGS. 4–7 and 14–18) can be repeated to form further interconnect layers, where the via dielectric layer 232 is considered to be the foundation layer and the via 230 is considered to be the trench. For example, FIG. 12 shows the integrated circuit portion 200 after a further barrier layer 214'has been formed above the via 230 and via dielectric 232. (FIG. 19 shows the integrated circuit portion 200 after a further barrier layer 214–has been formed above and via 230 and via dielectric 232.) A metal line 218', including an ARC layer 220', has been formed above the barrier layer 214'. An etch stop spacer 228'has been formed, as discussed with respect to FIGS. 4–10, so that the via 230 is completely overlapped even though the metal line 218'is misaligned to the via 230.

FIGS. 20–30 illustrate a method in accordance with the present invention.

Figure 20:
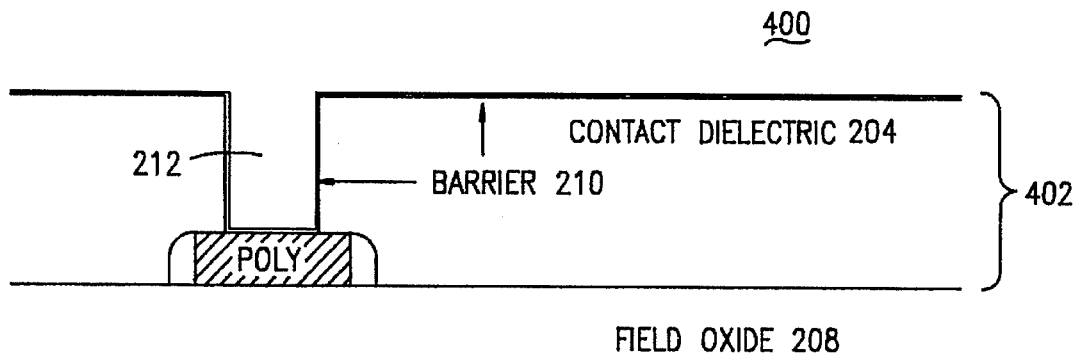

FIG. 20 shows an integrated circuit portion 400 which includes a foundation layer 402. The foundation layer 402 includes a dielectric layer 204 in which a trench 212 has been formed. In accordance with the invention, the dielectric layer 204 is covered by a barrier layer 210 such that the barrier layer 210 lines, but does not completely fill, the trench 212. As an example, the barrier layer may be a sputtered titanium ("Ti")/sputtered titanium nitride ("TiNx") bilayer; sputtered Ti/sputtered titanium-tungsten ("TiW") bilayer; sputtered Ti/sputtered tungsten ("W") bilayer; sputtered W single layer; sputtered Ti/chemical vapor deposited titanium nitride ("CVD TiNx") bilayer; or CVD Ti/CVD TiNx bilayer.

Figure 21:
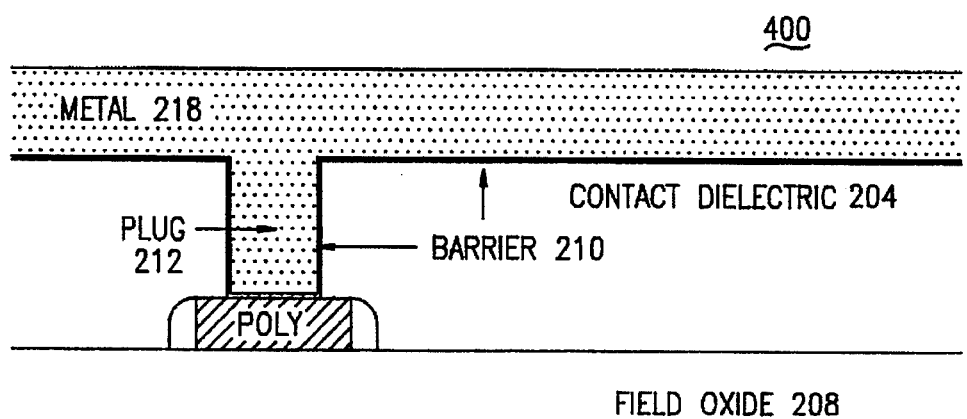

FIG. 21 shows the integrated circuit portion 400 after a bottom metal layer 218 has been formed. The bottom metal layer 218 covers the barrier layer 210 and, significantly, the metal layer 218 completely fills the trench 212. It should be noted that the method and architecture is independent of the metal and the method of depositing the metal. For example, Al and its alloys may be employed, deposited by CVD. Copper can also be employed, deposited by any deposition method. Optionally, the metal layer 218 includes an ARC layer 220.

Figure 22:
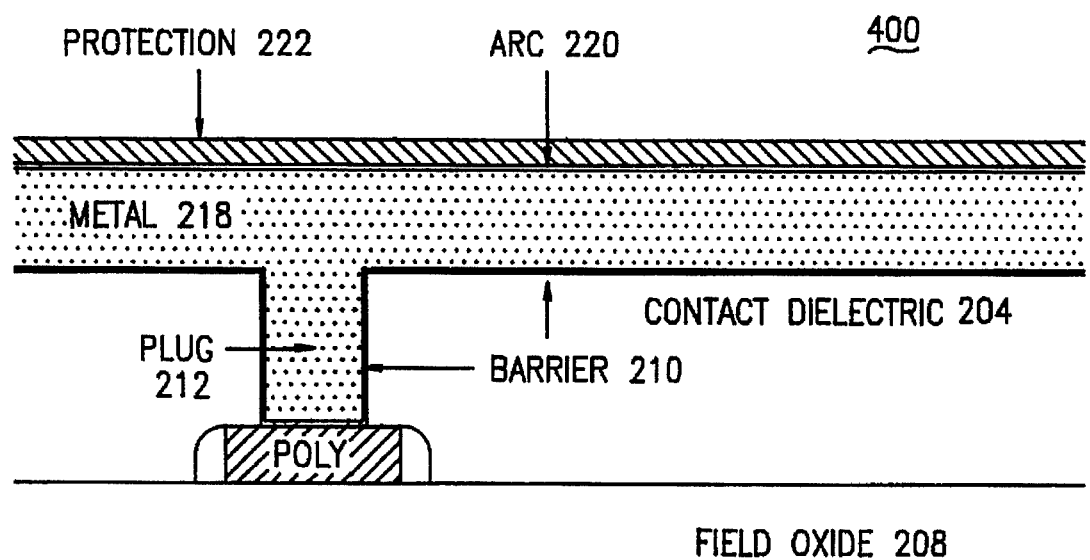
Figure 23:
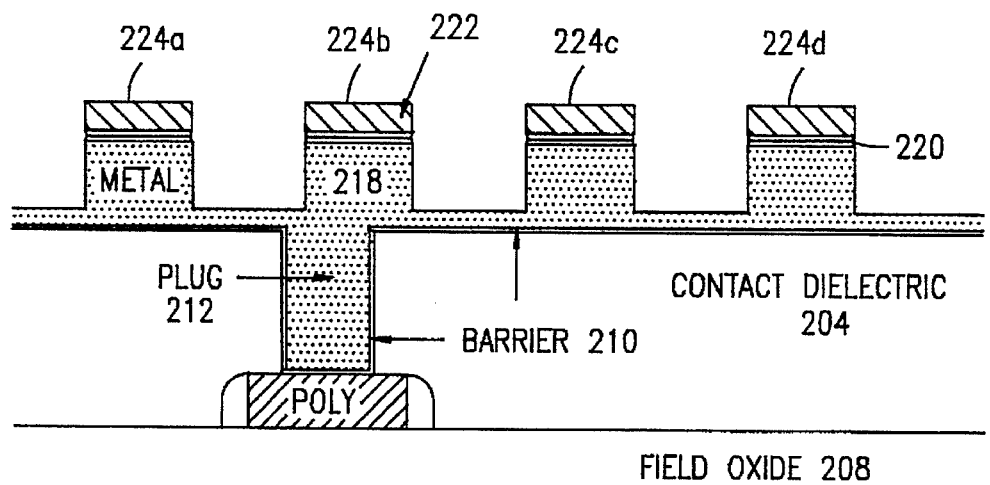

FIG. 22 shows the integrated circuit portion 400 after a protection layer 222 has been formed over the metal layer 218. FIG. 23 shows the integrated circuit portion 400 after the protection layer 222 and the bottom metal layer 216 have been patterned to define at least one line (four lines 224a–224d are shown in FIG. 23) of composite protection/ metal on the surface of the barrier layer 210. For example, the patterning may be accomplished by a bottom metal mask step and a timed bottom metal etch step. The etch chemistry may be, for example, an anisotropic fluorine-based etch chemistry to remove the portion of the protective silicon oxide below the photo-exposed photo-resist. Then, the metal is etched in an anisotropic chlorine-based etch chemistry. The etch is controlled by the set time which, depending on the metal thickness and etchant, is typically between one to sixty minutes.

With the timed process, the metal layer 218 is only partially etched. The plug (i.e., the filled trench 212) is protected from being etched, even if the metal mask is misaligned to the plug. At this point in the processing, the metal lines are defined but are not yet electrically isolated. Thus, in accordance with the present invention, it is not necessary to form a barrier layer on top of the plug 212. Furthermore, it is not necessary to use a different material for the metal layer and to fill the plug 212, or to use an etch process that selectively etches the metal layer 218 but not the plug 212 fill material.

Figure 24:
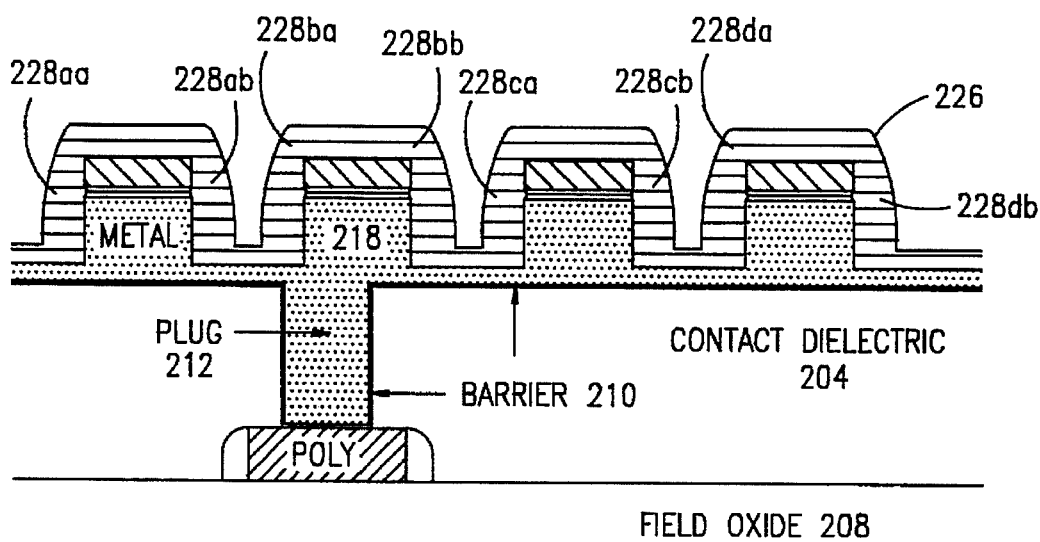

FIG. 24 shows the integrated circuit portion 400 after an etch stop layer 226 has been formed on the surface of the etched metal layer 218. The etch stop layer 226 substantially conforms to the shape of the lines 224a–224d of composite protection/metal and thus includes etch stop spacers 228aa–228db on the sidewall portions of the lines. The etch stop layer 226 may be, for example, PECVD silicon nitride.

Referring still to FIG. 24, the thickness of the etch stop layer 226 is such that the coverage on the sides of the bottom metal lines 224a–224d is at least as large as the potential via misalignment to bottom metal and to contact. In other words, the thickness of the etch stop layer 226 is such that the thickness of the etch stop spacers 228aa–228db is at least as large as the via overlap and enclosure, and contact overlap, which would be used in the conventional interconnect fabrication process. Furthermore, the etch stop material should be thin enough, relative to the space between the metal lines 224a–224d, so that key holes (i.e. voids within the dielectric) are not formed between the metal lines 224a–224d.

Figure 25:
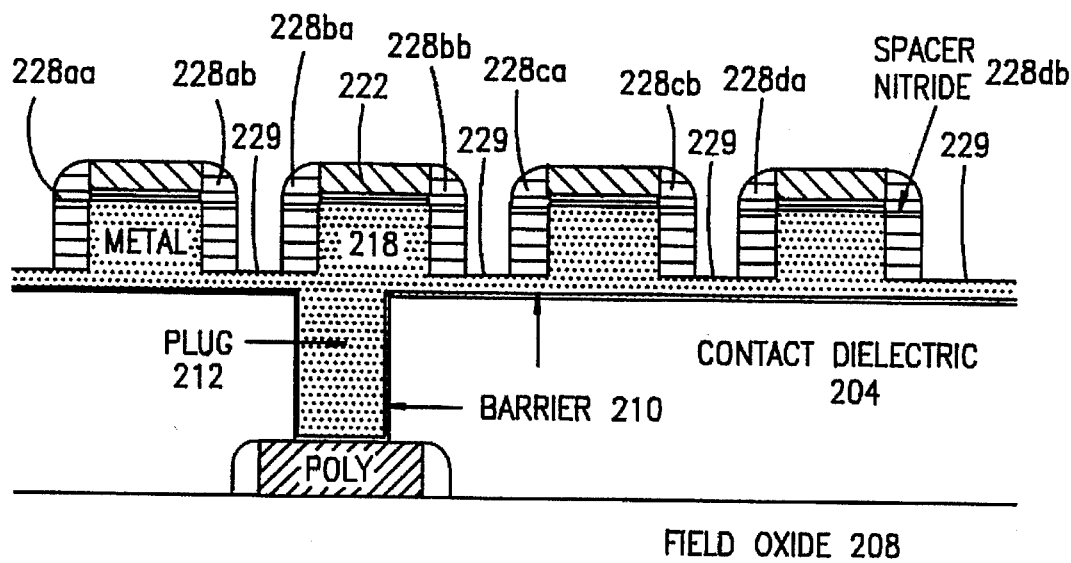

FIG. 25 shows the integrated circuit portion 400 after selected portions of the etch stop layer 226 have been removed, leaving the etch stop spacers 228aa–228db. Preferably, the etch is anisotropic (i.e., it etches only in the vertical direction) so that the thickness of the etch stop spacers 228aa–228db, on the sidewalls of the bottom metal lines 224a–224d, is preserved. The etch plasma selectivity chemistry is such that the etching stops in the protection oxide layer 222, on top of the metal lines 224a–224d. Furthermore, the protection oxide layer 222 ensures that, during etch, the top of the spacers 228aa–228dbremain above the top surface of the metal lines 224a–224d.

Figure 26:
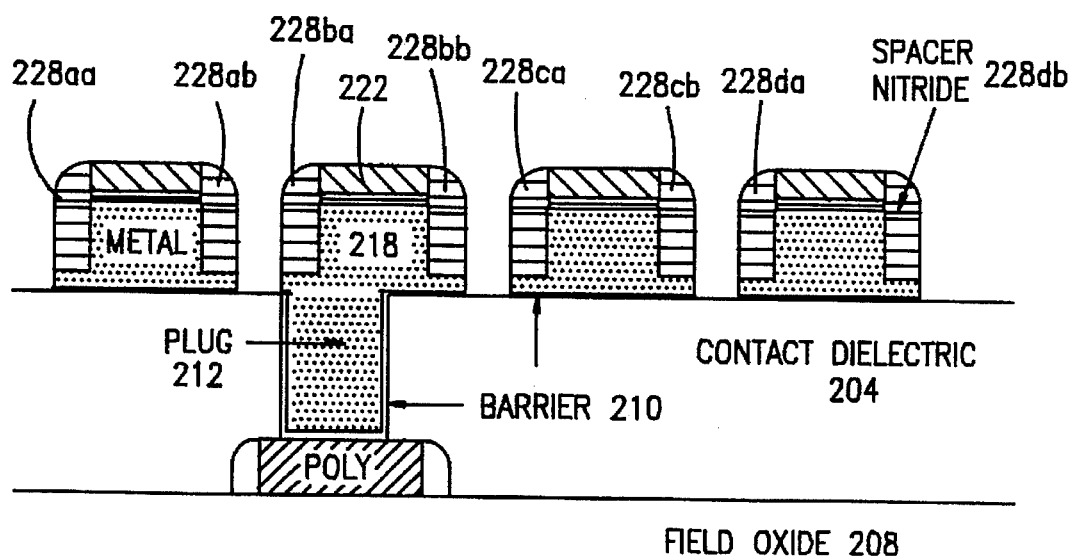

FIG. 26 shows the integrated circuit portion 400 after the portions of the metal layer between the etch stop spacers 228aa–228db have been removed to electrically isolate the bottom metal lines 224a–224dfrom each other. This may be accomplished, for example, by using a Cl-based etch chemistry to selectively and anisotropically remove the metal and the barrier (liner) layers.

Figure 27:
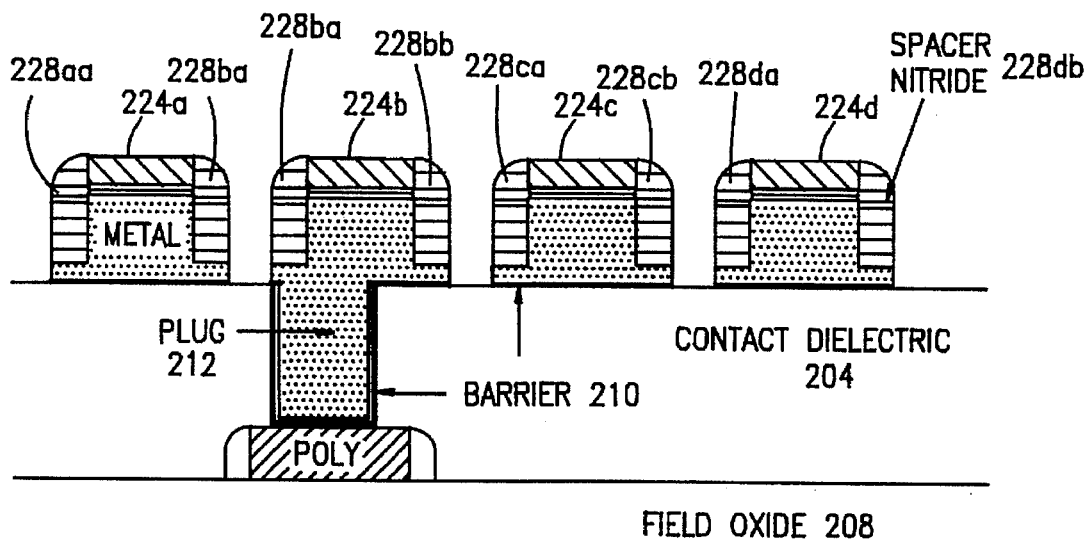
Figure 28:
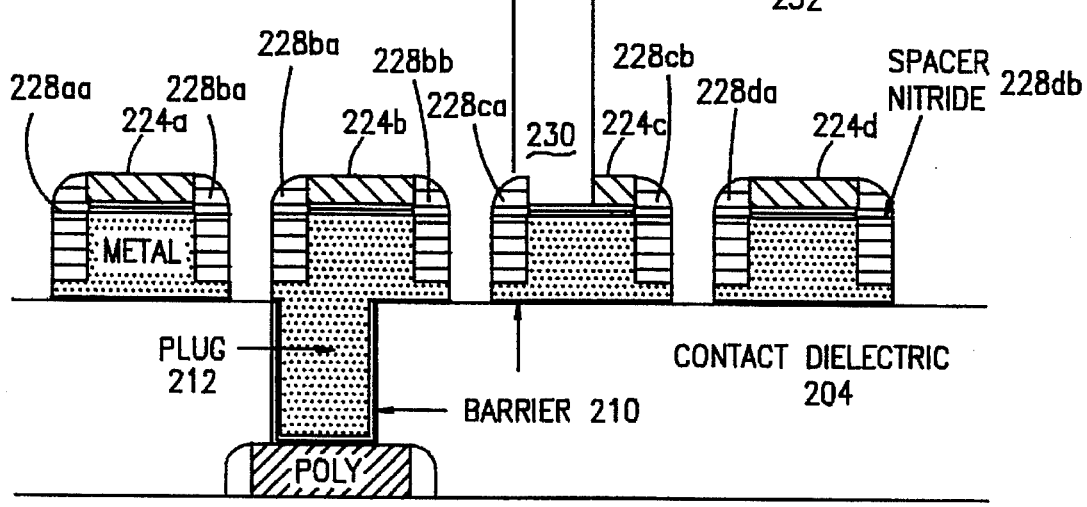

FIGS. 27 and 28 show the integrated circuit portion 400 after a misaligned via 230 has been formed above the metal line 224c. First, as shown in FIG. 27, a via dielectric layer 232 is formed that covers, and extends above, the metal lines 224a–224d. The via dielectric layer 232 can be formed, for example, by depositing gap-filling silicon oxide, such as spin on glass ("SOG") or TEOS-ozone silicon oxide. Optionally, after it has been deposited, the gap-filling oxide can be removed from the top of selected bottom metal lines using a blanket plasma etchback.

Then, if SOG has been used to fill the gaps between the bottom metal lines, the SOG is cured at an elevated temperature. The gap-filling oxide is then capped, e.g., with a layer of PECVD TEOS oxide or silane oxide. Preferably, a chemical-mechanical polishing process is then employed to planarize the surface. Then, as shown in FIG. 28, a portion of the via dielectric layer 232, above the metal line 224c, the metal line to be interconnected, is removed to expose a portion of the protection/metal line 224c. This is done, for example, by a fluorine-based plasma etch.

Figure 29:
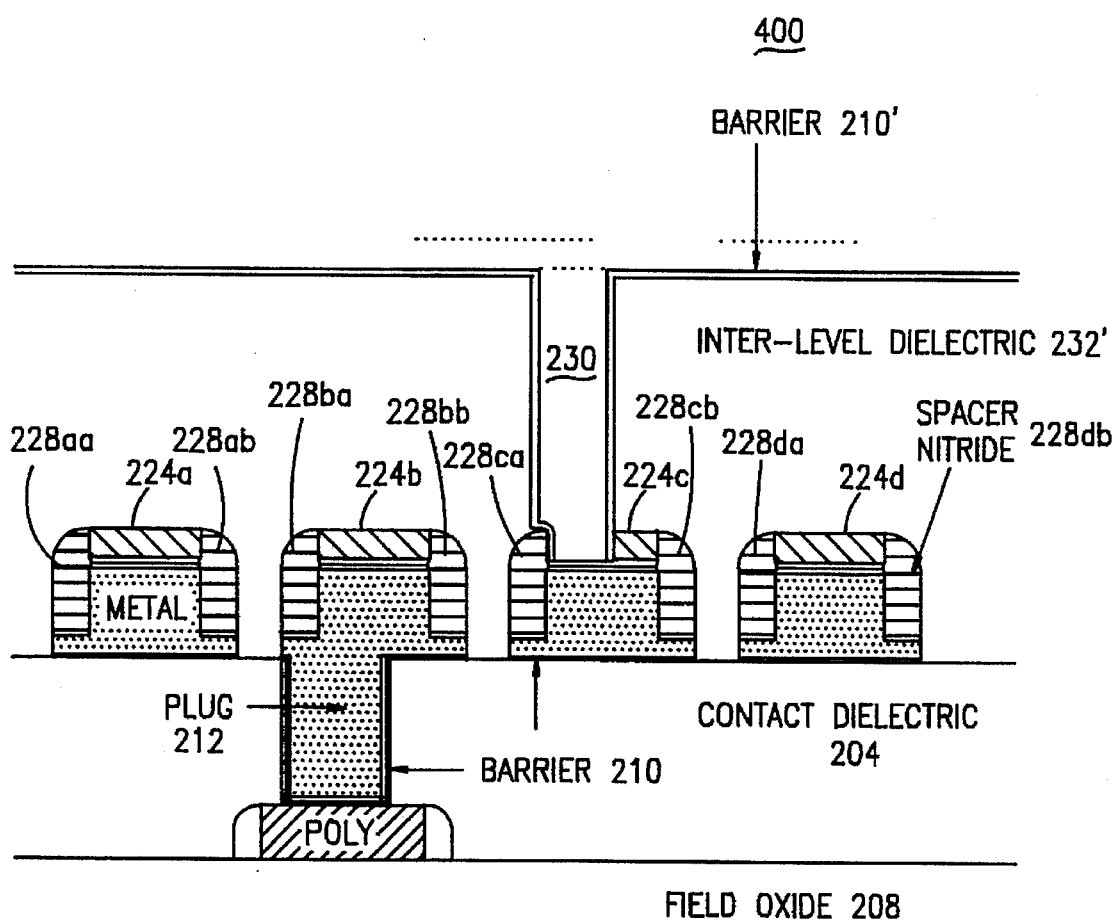

FIG. 29 shows the integrated circuit portion 400 after the via dielectric layer 232, including the via 230, has been covered with a barrier layer 210' in a manner similar to the barrier layer 210 formed on the dielectric layer 204, as discussed above with reference to FIG. 21. As can be seen from FIG. 29, even if the via 230 is misaligned with the metal line 224c, a portion of the via 230 not enclosed by the metal is enclosed by at least a portion of the etch stop spacer 228ca.

Figure 30:
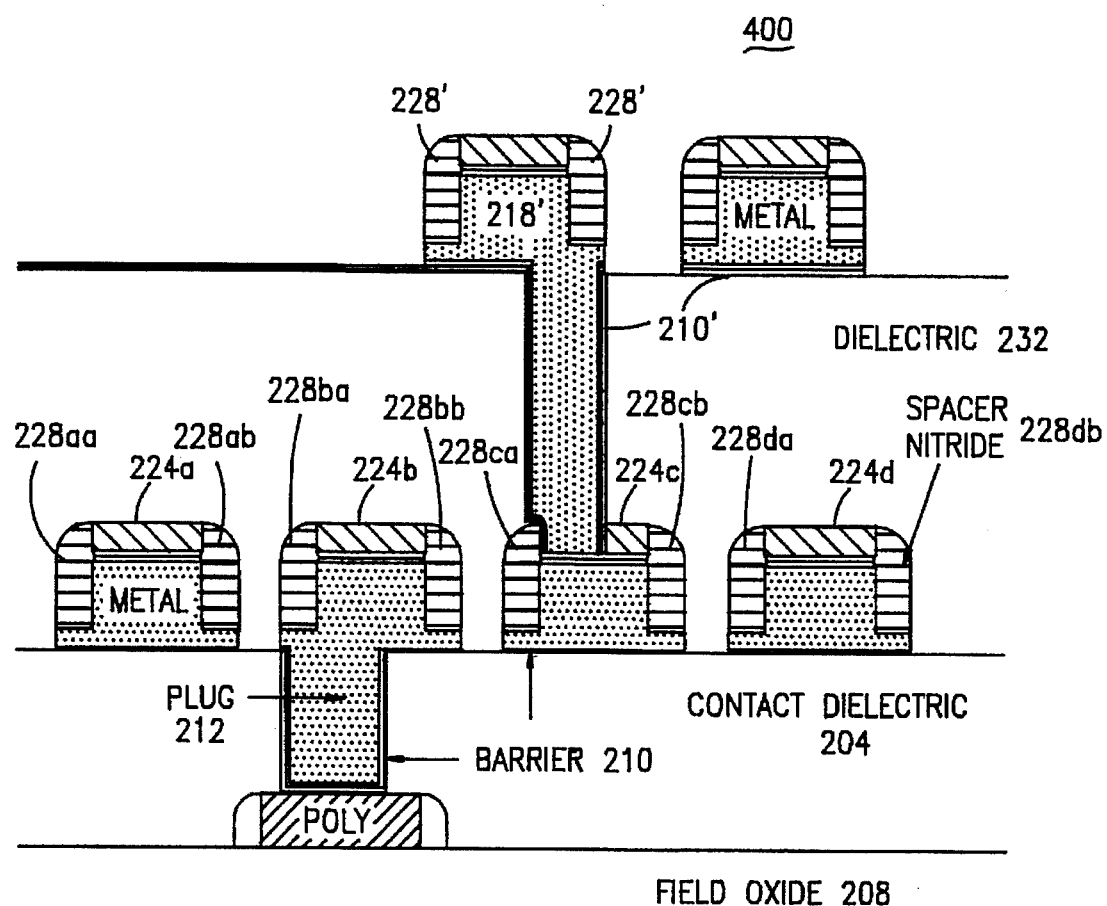

The process illustrated in FIGS. 20–29 can be repeated to form further interconnect layers, where the via dielectric layer 232 is considered to be the foundation layer and the via 230 is considered to be the trench. For example, FIG. 30 shows the integrated circuit portion 400 after a further barrier layer 214' has been formed over the via 230 and via dielectric 232. A metal line 218' has been formed above the barrier layer 210'. Etch stop spacers 228' have been formed, as discussed with respect to FIGS. 20–29, so that the via 230 is completely overlapped even though the metal line 218' is misaligned to the via 230.

A process for fabricating a borderless interconnect architecture, as well as the borderless interconnect architecture itself, has been described. The die size reduction which can be achieved with such an architecture is appreciable.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A method of forming interconnecting layers in a semiconductor device over a foundation layer, the foundation layer including a dielectric layer having at least one trench formed therein and a boundary layer that covers the dielectric layer including lining, but not completely filling, the trench:

a) forming a metal layer atop the foundation layer to cover the boundary layer, including completely filling the trench with metal;

b) forming a protection layer on the surface of the metal layer;

c) patterning the protection layer and the metal layer to define a line of composite protection/metal on the surface of the foundation layer while leaving a remaining portion of the metal layer exclusive of the metal of the line;

d) forming an etch stop layer which substantially conforms to the shape of the line and to the remaining portion of the metal layer;

e) removing selected portions of the etch stop layer to expose the protection surface of the line and to leave etch stop spacers conforming to at least one sidewall portion of the line while also exposing a sub-portion of the remaining portion of the metal layer;

f) removing the exposed sub-portion of the metal layer to expose a portion of the boundary layer;

g) removing the exposed portion of the boundary layer;

h) forming a layer of via dielectric that covers and extends above the line;

i) removing a portion of the via dielectric layer above the line to expose a portion of the protection surface of the line; and j) removing at least a portion of the protection surface from the line, leaving the metal portion of the line only, whereby even if the via is misaligned with the line, a portion of the via not enclosed by the metal is enclosed by at least one of the etch stop spacers and whereby the via is always capped by the metal.

2. The method of claim 1, wherein step c) comprises:

c1) forming a photo-resist layer on the surface of the protection layer;

c2) masking portions of the photo-resist layer to produce a desired interconnect pattern in the photo-resist;

c3) applying a protection layer etch chemistry to the protection layer to remove the portions of the protection layer that are not masked by the photo-resist, exposing portions of the metal layer; and c4) applying a timed metal layer etch chemistry to the metal layer to remove the exposed portions of the metal layer, defining the line of composite protection/metal while leaving the remaining portion of the metal layer exclusive of the metal of the line.

3. The method of claim 2, wherein the protection layer is an oxide, the protection layer etch chemistry is fluorine-based, and the metal layer etch chemistry is chlorine-based.

4. The method of claim 3, wherein the metal layer etch is anisotropic.

5. The method of claim 4, wherein the protection layer etch chemistry is anisotropic.

6. The method of claim 1, wherein in step d), the thickness of the etch stop spacers corresponds to an amount of via misalignment against which it is desired to guard against.

7. The method of claim 1, wherein step e) comprises:

e1) applying an etch chemistry to the etch stop layer which is such that the etch chemistry completely removes the selected portions of the etch stop layer while the etch chemistry removes only a portion of the protection layer which remains after step c).

8. The method of claim 7, wherein the protection layer comprises a silicon oxide, the etch stop layer is silicon nitride, and the etch chemistry to which the etch stop layer is exposed in step e1) comprises fluorine.

9. The method of claim 7, wherein the etch chemistry applied to the etch stop layer in step e1) removes the selected portions of the etch stop layer anisotropically.

10. The method of claim 1, wherein the metal layer includes a primary layer formed on the surface of the boundary layer and an anti-reflection coating formed on the surface of the primary layer.

11. The method of claim 1, wherein after steps a) through i) have been performed, the via dielectric layer is considered to be the foundation layer, with the via considered to be the trench, and the steps a) to i) are repeated.

* * * * *

UNITED STATES PATENT AND TRADEMARK OFFICE
CERTIFICATE OF CORRECTION

PATENT NO. : 5,656,543
DATED : August 12, 1997
INVENTOR(S) : Henry Wei-Ming Chung It is certified that error appears in the above-identified patent and that said Letters Patent is hereby corrected as shown below:

On the Cover Page, at [22], delete "Aug. 25, 1995" and replace with
--Aug. 24, 1995--.

Signed and Sealed this

Twenty-sixth Day of May, 1998

Attest:

BRUCE LEHMAN

Attesting Officer

Commissioner of Patents and Trademarks